United States Patent [19]

Geist et al.

[11] Patent Number: 4,961,107
[45] Date of Patent: Oct. 2, 1990

[54] ELECTRICALLY ISOLATED HEATSINK FOR SINGLE-IN-LINE PACKAGE

[75] Inventors: Henry E. Geist, Scottsdale; Eugene E. Segerson, Tempe, both of Ariz.

[73] Assignee: Motorola Inc., Schaumburg, Ill.

[21] Appl. No.: 331,716

[22] Filed: Apr. 3, 1989

[51] Int. Cl.⁵ .................. H01L 23/40; H01L 23/36
[52] U.S. Cl. ................................ 357/81; 357/74; 357/75; 357/68
[58] Field of Search ............... 357/81, 81 C, 75, 68, 357/74

[56] References Cited

U.S. PATENT DOCUMENTS

| | | | |
|---|---|---|---|
| 3,982,271 | 9/1976 | Olivieri et al. | 357/81 |
| 4,095,253 | 6/1978 | Yoshimura et al. | 357/81 |
| 4,541,005 | 9/1985 | Hunter et al. | 357/81 |
| 4,800,956 | 1/1989 | Hamburgen | 357/81 |
| 4,807,018 | 2/1989 | Cellai | 357/81 |

FOREIGN PATENT DOCUMENTS

| | | | |
|---|---|---|---|
| 2747393 | 4/1978 | European Pat. Off. | 357/81 C |
| 2303119 | 8/1973 | Fed. Rep. of Germany | 357/81 C |
| 0074458 | 4/1985 | Japan | 357/72 |
| 0170248 | 9/1985 | Japan | 357/81 |
| 67248 | 4/1986 | Japan . | |
| 61-67248 | 4/1986 | Japan | 357/81 |
| 181452 | 7/1988 | Japan . | |
| 0284840 | 11/1988 | Japan | 357/74 |
| 1-59843 | 3/1989 | Japan | 357/81 |

*Primary Examiner*—Andrew J. James
*Assistant Examiner*—Viet Q. Nguyen
*Attorney, Agent, or Firm*—Robert M. Handy

[57] ABSTRACT

An improved semiconductor device package and method include, in a first embodiment, a die supporting leadframe having fingers inside the package body which are interleaved with mating fingers of a metallic heat extractor, without touching. A thermally conductive encapsulation fills the spaces between and around the fingers to provide thermal coupling and electrical isolation. The heat extractor extends outside the package body. Alternatively, the heat extractor and the leadframe have large parallel faces inside the package body which are arranged in a face-to-face relationship, without touching. An insulating spacer locks the opposing faces in the spaced-apart, electrically isolated relationship. An encapsulation fills any remaining space between the faces to provide efficient thermal coupling.

15 Claims, 2 Drawing Sheets

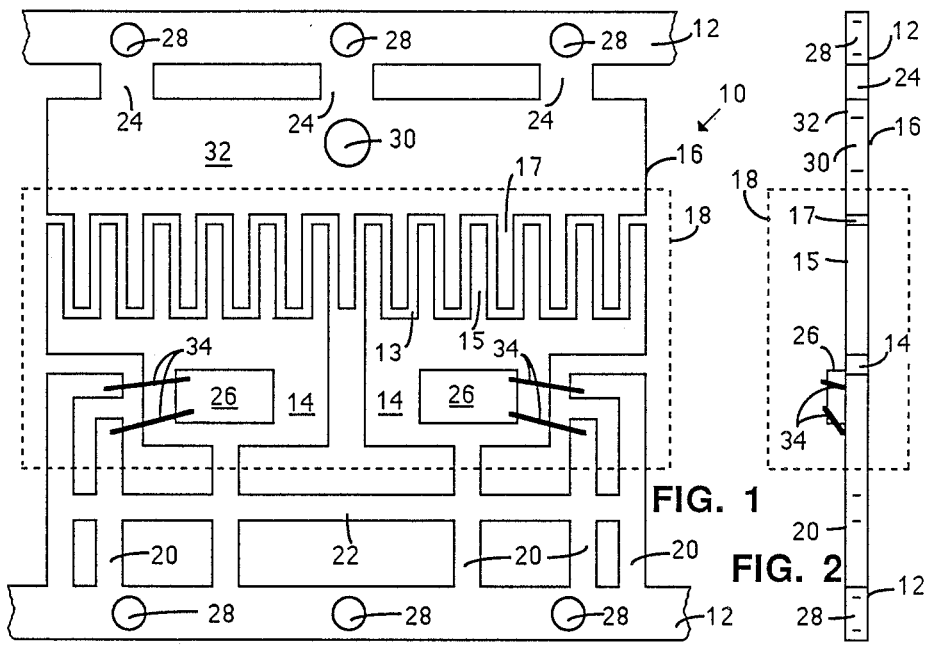
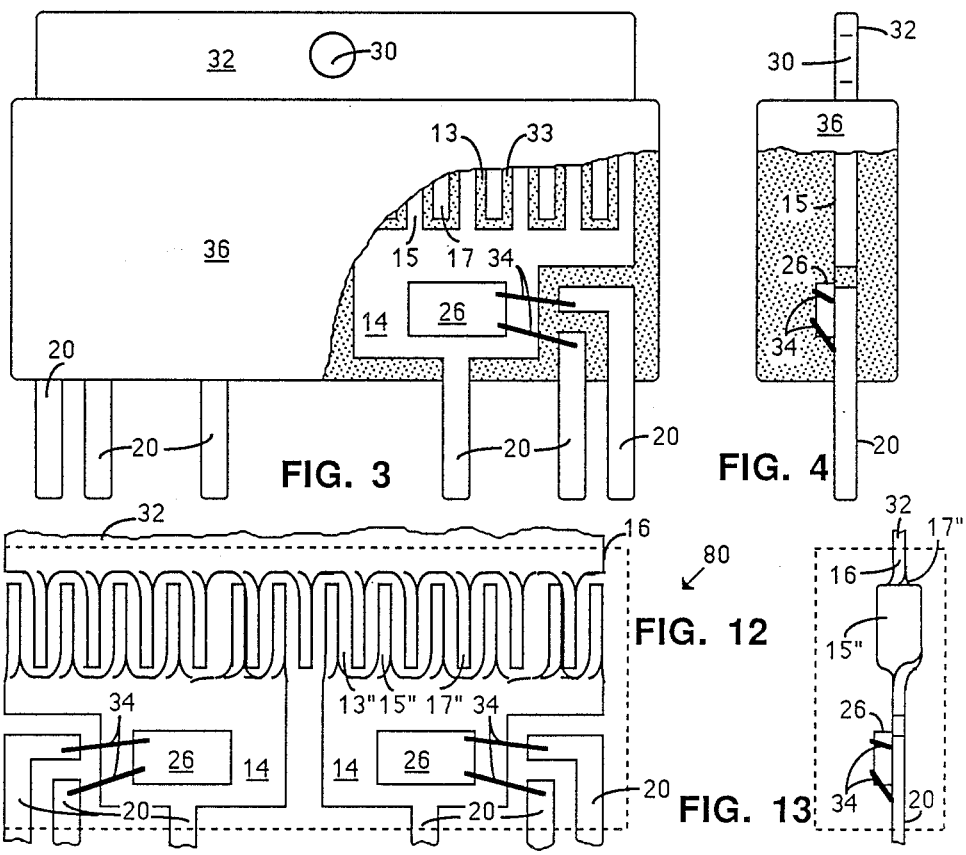

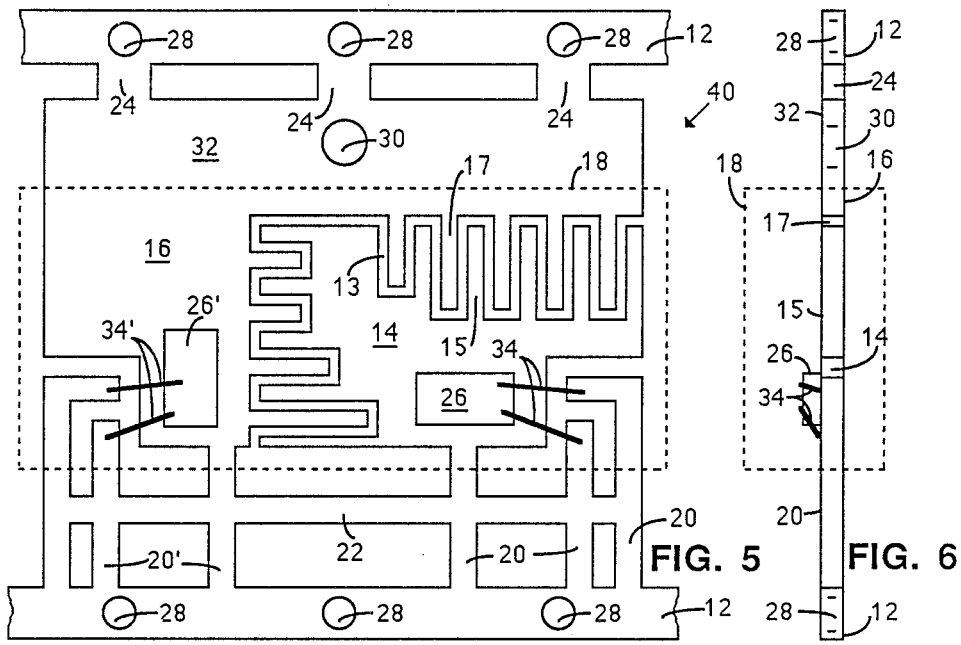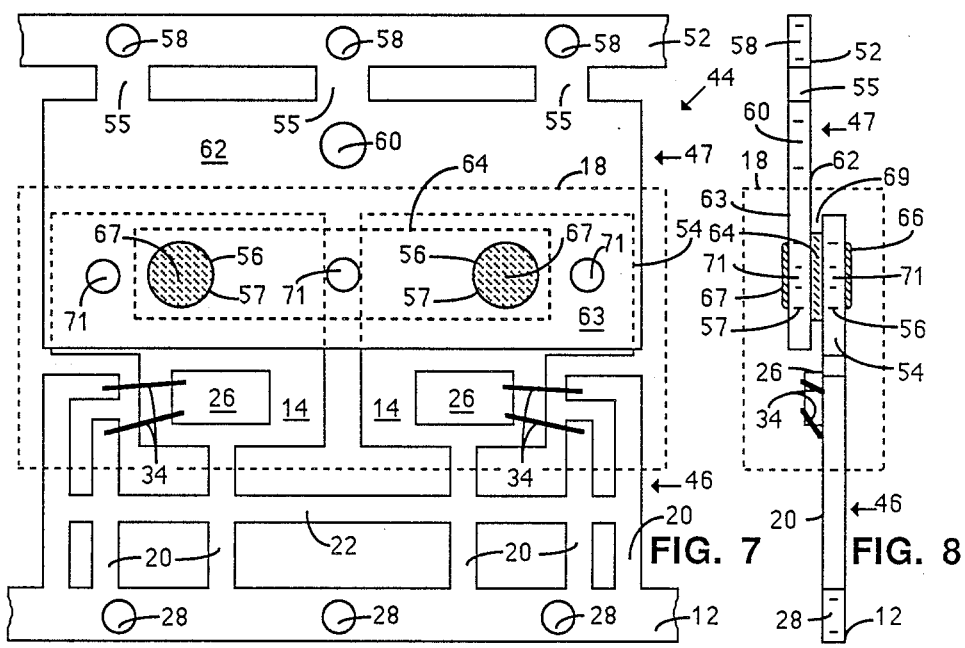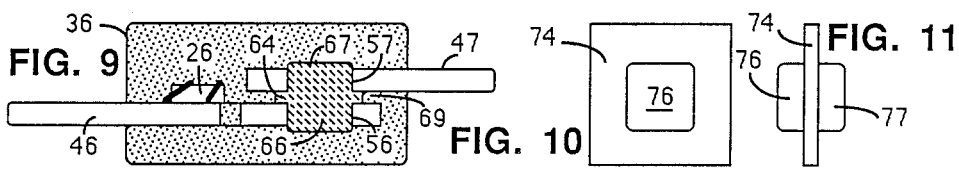

4,961,107

ELECTRICALLY ISOLATED HEATSINK FOR SINGLE-IN-LINE PACKAGE

FIELD OF THE INVENTION

This invention concerns improved electronic device packages and, more particularly, an improved single-in-line package for semiconductor and other electronic elements.

BACKGROUND OF THE INVENTION

Single-in-line packages (SIP's) are well known in the electronics art, particularly the semiconductor art. SIP's are an electronic device or circuit package style which have a single row of generally flat leads protruding from one edge. The flat leads usually lie in the same plane. The SIP package may contain one or more electronic elements, as for example, semiconductor devices or integrated circuits.

It is frequently desired to provide a heat spreader fin protruding from the package that aids in removal of heat from the internally mounted chips. In the prior art, this heat spreader has usually been formed by extending the portion of the leadframe on which one or more of the electronic elements are mounted so as to protrude from the package body. A SIP having an externally protruding heat spreader is described for example in U.S. Pat. No. 4095253 which is incorporated herein by reference. A difficulty with this and other prior art SIP devices is that the semiconductor or IC die, for example, is directly bonded to this heat spreader. The heat spreader then has the same electrical potential as the die or IC substrate. This is often undesirable.

Electrically isolated heat spreaders can be obtained by providing an insulating material, e.g., alumina or beryllia, between the die and die bond portion of the heat spreader. However, this has a number of disadvantages well known on the art. Among these are the high cost of such materials and the additional manufacturing steps needed to mount them on the heatspreader and then mount the die thereon.

Accordingly, it is an object of the present invention to provide a means and method for improved heat removal from SIP type devices where the externally protruding heat spreader is electrically isolated from one or more of the electronic elements within the SIP. It is a further object of the present invention to provide the above-noted advantages and objects without use of insulators between the electronic elements and the die bond portion of the leadframe on which they are mounted. It is an additional object to provide the above-noted advantages and objectives more simply and at lower cost than in the prior art.

SUMMARY OF THE INVENTION

The foregoing and other objects and advantages are obtained by the means and method of the present invention wherein there is provided, in a first embodiment, an electronic device comprising a leadframe, desirably formed from a single, flat sheet of metal, and having a die mount portion and a heat spreader portion which are electrically isolated but thermally coupled, wherein the die mount portion and the heat spreader portion have interdigitated closely spaced-apart fingers separated and surrounded by a thermally conductive electrically insulative material. The leadframe also includes leads for external connection. The leads and part of the heatspreader extend beyond the package encapsulation.

An electronic device is formed by providing the above-described leadframe, mounting electronic element(s) thereon, coupling the element(s) to the device leads, forming an insulating encapsulation substantially surrounding the electronic element(s) and the fingers, and filling the gaps between the fingers, and removing any side-rails, dam bars and/or supports associated with the leadframe.

In a second embodiment, a two-piece leadframe is utilized with the first piece comprising the heatspreader and the second piece comprising the die mount portion, wherein the heatspreader portion and the die mount portion include large flat regions juxtaposed in a closely spaced overlapping face-to-face but separated relationship with the small space therebetween filled with a thermally conductive, electrically insulative material. For ease of handling during manufacture it is convenient to provide one or more openings in each portion which are engaged by protrusions on a small thermally conductive and electrically insulative spacer which locks the heatspreader and die bond portion in the juxtaposed closely spaced relationship during assembly and encapsulation. The encapsulation desirably surrounds and encloses the spacer, filling any remaining voids between the juxtaposed parts.

An electronic device is formed by providing the separate pieces of the above-described two-piece leadframe, engaging the separate pieces in the desired face-to-face spaced-apart fashion, mounting electronic element(s) thereon, coupling the element(s) to the device leads, forming an insulating encapsulation substantially surrounding the electronic element(s) and filling any remaining gap between the face-to-face spaced-apart portion of the two-piece leadframe, and removing any side-rails, dam bars and/or supports associated with the leadframe. The two-piece leadframe may be assembled before or after the electronic element(s) are mounted on the die bond portion and coupled to the leads.

The present invention will be more fully understood in view of the accompanying drawings and description that follows. The words "die" and "chip" are used interchangeably herein to indicate an electronic element of any type intended to mounted in the SIP, as for example but not limited to, semiconductor elements of any kind, IC's, chip capacitors and resistors, LED's and so forth. These internally mounted electronic elements may or may not have separate encapsulation thereon.

BRIEF DESCRIPTION OF THE DRAWINGS

FIG. 1 is a plan view in simplified form of a leadframe and electronic device according to the present invention;

FIG. 2 is a right side view of the device of FIG. 1;

FIG. 3 is a simplified plan and partial cut-away view of the device of FIG. 1 after encapsulation and removal of part of the leadframe;

FIG. 4 is a side and partial cut away view of the device of FIG. 3;

FIG. 5 is a plan view similar to FIG. 1 but according to another embodiment of the present invention;

FIG. 6 is a right side view of the device of FIG. 5;

FIG. 7 is a plan view analogous to FIG. 1 but according to a further embodiment of the present invention;

FIG. 8 is a right side view of the device of FIG. 7;

FIG. 9 is a cut away right side view of the device of FIGS. 7-8 after encapsulation and removal of part of the leadframe;

FIG. 10 is a simplified plan view of an internal member of the device of FIGS. 7-9. but according to a further embodiment thereof;

FIG. 11 is a right side view of the internal member of FIG. 10;

FIG. 12 is a simplified plan view of a portion of the device of FIG. 1, but according to a still further embodiment; and FIG. 13 is a right side view of the device portion of FIG. 12.

DETAILED DESCRIPTION OF THE DRAWINGS

FIG. 1 is a plan view and FIG. 2 is a right side view of improved leadframe 10 for the construction of an electronic device. Leadframe 10 includes removable side rails 12, die bonding portion 14 and heat spreader portion 16. Die bond portion 14 and heatspreader portion 16 have, respectively, interdigitated finger-like extensions 15, 17 separated by gap 13. Leadframe 10 is desirably of highly conductive metal, as for example, copper or aluminum or various well known conductive alloys of copper or alloys of aluminum or of other metals.

The configuration illustrated in FIGS. 1-6 may be conveniently formed from a single piece of substantially flat stock by etching or stamping. It is convenient but not essential that fingers 15, 17 are substantially coplanar. However, it is important that fingers 15, 17 be closely spaced without touching and have the largest practicable facing area to as to minimize the thermal impedance therebetween.

Dotted line 18 indicates the location of encapsulation 36 that will cover fingers 15, 17 and die bond portion 14, and fill gap 13. The part 32 of heatspreader portion 16 that lies outside outline 18 is external to device encapsulation 36. Leads 20 also extend outside the encapsulation for making external connection to the device.

For convenience of manufacture, leadframe 10 is provided with removable dam bars 22 and supports 24. Electronic element 26, for example a semiconductor device or integrated circuit die, is mounted on die bonding portion 14. Holes 28 in side-rails 12 serve as alignment or location or indexing points. Hole 30 in external portion 32 of heatspreader 16 is for the convenience of the user in attaching further heat removal means to heatspreader 16. Bonding means 34, e.g., wire bonds, connect die 26 to leads 20. Means and methods for forming such leadframes, and attaching die 26 and wires 34 and providing encapsulation 36 are well known in the art.

FIGS. 3-4 show respectively a partial cut-away plan and right side view of the device of FIGS. 1-2 after encapsulation 36 is formed as indicated by outline 18 and after rails 12, dam bars 22 and supports 24 have been removed. It is convenient to form encapsulation 36 of molded plastic. Transfer molding is a well known in the art for this purpose. Portion 33 of encapsulation 36 fills gap 13 between fingers 15, 17. It is important that encapsulation 36 be of a material that is electrically insulating and thermally conducting. This provides electrical isolation and thermal coupling between die bond portion 14 and heatspreader 16 so that a significant amount of heat may be removed from electronic element 26 via die bond portion 14, fingers 15, 17 to heatspreader 16 and external portion 32 where it is coupled to the environment. In the configuration of FIGS. 1-4, die 26 and die bond portion 14 are electrically isolated but thermally coupled to heatspreader 16 with external tab 32.

While the configuration illustrate in FIGS. 1-4 (and elsewhere in the description) shows multiple die and bonding regions, those of skill in the art will understand that the present invention is useful for SIP's having any number of die therein, including a single die or more than one die, and any type of electronic element or elements.

A further embodiment of the present invention is illustrated in FIGS. 5-6 which are similar to FIGS. 1-2, respectively. Leadframe 40 of FIGS. 5-6 differs from leadframe 10 of FIGS. 1-2 in that only one of the two electronic elements 26, 26' is isolated from heat spreader 16. Electronic die 26 is mounted on die bonding portion 14 having finders 15 spaced apart from fingers 17 of heat spreader 16, so that die 26 is electrically isolated but thermally coupled to external heatsink tab 32. However, die 26' is mounted directly on heatspreader 16 and therefor not electrically isolated from external heatsink tab 32. The arrangement of FIGS. 5-6 illustrates that the present invention is useful in situations where it is desired to electrically isolated only a part of the electronic elements within the SIP from external heatsink tab 32. Following encapsulation, the external appearance of the device formed on leadframe 40 is the same as shown in FIGS. 3-4 since encapsulation 36 covers gap 13, fingers 15, 17 and die 26, 26'.

FIGS. 7-8, which are analogous to FIGS. 1-2 illustrate a further embodiment of the present invention. In FIGS. 7-8 two piece leadframe 44 comprises lower portion 46 and upper portion 47. Lower portion 46 in this example, is similar to the lower portion of leadframe 10 of FIGS. 1-2 and has, as before, side rail 12, leads 20, alignment holes 28, and die 26 bonded onto bonding portion 14. However, bonding portion 14 of FIGS. 7-8 lacks fingers 15, and instead has large flat region 54 with hole or alignment means 56. Upper portion 47 comprises side-rail 52 with alignment holes 58, and supports 55. Outline 18 indicates the approximate location of encapsulation 32 to be subsequently provided. Upper portion 47 has external portion 62 analogous to external portion 32 outside encapsulation outline 18 and with hole 60 analogous to hole 30. Interior part 63 of upper portion 47 is juxtaposed in a closely spaced-apart face-to-face relationship with part 54 of lower portion 46.

Lower portion 46 and upper portion 47 are held in the closely spaced-apart face-to-face relation ship by insulating means 64 placed therebetween. Bosses 66, 67 of insulating means 64 engage holes 56, 57 in lower portion 46 and upper portion 47, respectively. Additional holes 71 are desirably provided in upper portion 47 and/or lower portion 46 to facilitate the flow of encapsulant into gap 69 therebetween. Where the size of the SIP permits, it is desirable to use at least two spaced-apart engagement points between insulating spacer means 64 and leadframe portion 46, 47 so that portions 46, 47 cannot move relative to one another during assembly and encapsulation. This arrangement is shown in FIG. 7 where spacer 64 has two pairs of bosses 66, 67 extending through pairs of holes 56, 57 in leadframe portion 46, 47.

FIG. 9 shows a simplified partial cut-away right side view of the arrangement of FIGS. 7-8 after encapsulation and removal of side rails 28, 58, supports 55, and dam bars 22. It will be noted that insulating spacer 64 has bosses 66, 67 engaging holes 56, 57 in lower 46 and upper 47 portions of leadframe 44, respectively. Bosses 66, 67 are conveniently slightly rounded on their extremities to facilitate insertion in holes 56, 57. While use of pairs of holes and pairs of bosses as indicated in FIG. 7 is convenient, other shapes for insulating spacer 64 will also serve. FIGS. 10 and 11 illustrate respectively, top and side views of insulating spacer 74 having rectangular bosses 76, 77 intended to engage square openings in portions 46, 47. In this way, a there need only be one engagement opening each in lower portion 46 and upper portion 47, rather than the two illustrated in FIGS. 7-8. This saves space. As those of skill in the art will appreciate based on the description herein, insulating spacer 64, 74 and bosses 66, 67; 76, 77 may have any convenient shape. It is desirable, if one rather than a pair of holes is to be employed to use a boss shape (e.g., non-circular) that precludes mutual rotation of portions 46, 47.

Insulated spacer 64, 74 is desirably of plastic although other insulating materials may also be used. Any portions of gap 69 between lower portion 46 and upper portion 47 of leadframe 44 that is not occupied by spacer 64, 74, is filled by encapsulant 36 so as to provide a large area thermal path between the two portions of the leadframe. In this way, heat is efficiently removed from die 26 through bonding region 14, to lower large facing region 54, through plastic spacer 64, 74 and encapsulation 36 to upper large facing portion 63 and thence to external portion 62 where it may be removed to the environment. Although the arrangement of FIGS. 7-11 may be slightly more costly than the arrangement of FIGS. 1-2 because of the need for a two-piece leadframe, the arrangement of FIGS. 7-11 is expected to provide superior thermal performance.

FIGS. 12-13 illustrate a further embodiment of the present invention. Leadframe portion 80 of FIGS. 12-13 is similar to leadframe 10 of FIGS. 1-2 except that fingers 5", 17" of FIGS. 12-13 are rotated out of the plane of bonding portion 14 and heatspreader 16 so as to have their broad faces aligned substantially perpendicular thereto. In this way the face-to-face area of metal separated by plastic in gap 13" is increased compared to the arrangement of FIGS. 1-4. In other respects, the arrangement of FIGS. 12-13 is similar to the arrangement illustrated in FIGS. 1-4 and the finished encapsulated device is identical in outward appearance. As with the arrangement of FIGS. 1-4, the arrangement of FIGS. 12-13 can be fabricated as a single piece leadframe from a single sheet of metal.

The twisted finger arrangement of FIGS. 12-13 is more complex than the flat finger arrangement of FIGS. 1-4 and the latter arrangement is preferred unless the greater finger-to-finger separation provided by the arrangement of FIGS. 12-13 is advantageous. This occurs, for example where a very high breakdown voltage is desired. The twisted finger arrangement provides greater heat transfer area but larger finger-to-finger spacing and so one may obtain adequate thermal performance with greater voltage stand-off capability.

Electronic devices employing the leadframes described in connection with FIGS. 1-6 and 12-13 are formed by providing a leadframe having a die mount portion and a heat spreader portion which are electrically isolated but thermally coupled, wherein the die mount portion and the heat spreader portion have interdigitated closely spaced-apart fingers, mounting an electronic component on the die mount portion of the leadframe, and providing a thermally conductive electrically insulative material surrounding and separating the interdigitated closely spaced-apart fingers. The leadframe is formed by means well known in the art, as for example, etching or stamping, and preferably from a single piece of highly conductive metal. It is convenient to use a substantially flat metal for the leadframe. Various parts of the leadframe may be down-formed or up-formed using means well known in the art to provide lowered or raised portions as may be desired. Similarly, rotated fingers 15", 17" shown in FIGS. 12-13 are formed using methods well known in the art, as for example, bending or stamping.

Electronic devices employing the leadframe and other parts described in connection with FIGS. 7-11 are formed by providing a two-piece leadframe having a die mount portion and a heat spreader portion, wherein the die mount portion and the heat spreader portion have large flat regions juxtaposed in a closely spaced-apart overlapping face-to-face but separated relationship, and providing a thermally conductive, electrically insulative material between the closely spaced-apart overlapping face-to-face large flat regions. It is desirable to provide a thermally conductive and electrically insulative spacer means between the die mount portion and the heat spreader portion for holding them in the juxtaposed relationship. Further it is desirable that the first providing step comprise providing a two-piece leadframe having therein one or more engagement means for engaging the insulative spacer means and the second providing step comprise providing an encapsulation at least around the closely spaced-apart face-to-face large flat regions. The electronic element or elements are conveniently affixed to the die mount portion and connected to the device leads either before or after the two-piece leadframe is assembled, and before encapsulation.

Means and methods for forming two-piece leadframes are well known in the art, as for example, etching or stamping. It is convenient to use substantially flat metal for forming the pieces of the two-piece leadframe, but this is not essential. As described above, various down-formed or up-formed regions may be provided therein. It is important that the steps for forming the pieces of the two-piece leadframe provide comparatively large flat regions which can be juxtaposed in a closely spaced-apart face-to-face relationship, as described above, to permit efficient heat transfer through the intervening insulator. Plastic is a suitable material for spacer 64, 74 and for enclosing encapsulation 36. They are formed using means well known in the art, such as for example, transfer molding or injection molding. Other insulating materials, e.g., ceramics and glasses, may also be used but generally require higher temperature processing.

As those of skill in the art will appreciate based on the description herein, the foregoing provides an SIP type device having improved heat removal where the externally protruding heat spreader is electrically isolated from one or more of the electronic elements within the SIP. Further, the above-noted advantage is obtained without use of insulators between the electronic elements and the die bond portion of the leadframe on which they are mounted. In addition, the invented arrangement is able to use, in several embodiments, a single-piece leadframe that can be stamped or etched from a single flat metal piece, or in another embodiment, a two-piece leadframe where each piece can be fabricated from a flat metal sheet and where the two pieces are held in close proximity and alignment during assembly by an inexpensive insulating plastic spacer. It will be further understood by those of skill in the art that the insulating spacer may have a variety of shapes and that the engagement means on the leadframe for engaging the insulating spacer may also have a corresponding variety of shapes, so long as they provides for mutual engagement of the two portions of the leadframe in a thermally coupled, electrically insulated, closely spaced-apart face-to-face relationship.

Those of skill in the art will also appreciate based on the teachings herein that various modifications may be made in the details of the present invention without departing from the spirit thereof. For example, and not intended to be limiting, the geometry of the interdigitated fingers may be varied or the geometry of the large face-to-face regions may be varied or different types and numbers of electronic elements may be used or different materials may be used for the leadframes and the insulating spacer and the encapsulant or the shape of the insulating spacers and leadframes may be varied. Accordingly, it is intended to include all such variations in the claims that follow.

We claim:

1. An electronic device comprising a metallic member having a die mount portion and a heat spreader portion which are electrically isolated, wherein the die mount portion and the heat spreader portion each have multiple fingers extending toward the other which are interleaved without touching, and a thermally conductive, electrically insulating material surrounding and separating the interleaved fingers, wherein the interleaved fingers lie in substantially the same plane.

2. An electronic device comprising:
a first metal member having thereon an electronic die and having an exposed lead portion for external electrical connection to the die;
a second metal member having an exposed heat-spreader for removing heat from the die, wherein the first and second metal members have large parallel faces arranged in a closely spaced face-to-face relationship without touching;
a thermally conductive and electrically insulating spacer between the large parallel faces of the first and second metal members, wherein the spacer has first portions that engage the first and second metal members for preventing relative motion thereof; and
a separate thermally conductive, electrically insulating encapsulant enclosing the die and substantially filling remaining space between the large parallel faces of the first and second metal members, if any.

3. The device of claim 2 wherein the spacer has second portions for separating the faces by a predetermined distance.

4. The device of claim 2 wherein each of the large parallel faces of the first and second metal members comprises at least one opening into which a mating part of the first portions of the spacer extend.

5. The device of claim 2 wherein each of the large parallel faces of the first and second metal members comprises at least two openings into which mating parts of the first portions of the spacer extend.

6. An electronic device comprising: one or more electronic elements; metallic members comprising, a first region for bonding the one or more electronic elements thereto, a second region for receiving electrical connections to the one or more electronic elements, and a third region electrically isolated from but thermally coupled to the first region for removing heat from the electronic elements, wherein the first region comprises multiple fingers extending toward the third region, wherein the third region comprises a first exposed part for making thermal connection to the device and a second part connected to the first part and having multiple fingers extending toward and interdigitated with but not touching the fingers of the first region, leaving spaces therebetween; and encapsulation means for substantially surrounding the one or more electronic elements and substantially filling the spaces between the interdigitated fingers for providing thermal coupling between the first and third regions, wherein the first and third regions are substantially coplanar.

7. The device of claim 6 wherein the interdigitated fingers lie substantially in the same plane.

8. An electronic device comprising:
first conductive lead means for supporting an electronic component on a first side thereof and having a second side thereof opposite the first side thereof for extracting heat from the component, and further having one or more extensions for making electrical connections to the component;
second conductive lead means having a first side facing but spaced apart from the second side of the first lead means, and further having one or more extensions for making thermal connection thereto;
spacer means for locking the second side of the first lead means and the first side of the second lead means in spaced-apart, face-to-face relationship, and preventing relative rotation of the first and second lead means; and
means for encapsulating the electronic component and the spacer means, but not the extensions.

9. The device of claim 8 wherein the second side of the first lead means and the first side of the second lead means are substantially parallel.

10. The device of claim 9 wherein the second side of the first lead means and the first side of the second lead means are substantially flat.

11. A method for forming an electronic device, comprising:
providing a leadframe having a die mount portion and a heat extraction portion, wherein the die mount portion and the heat extraction portion each have parallel faces arranged in a closely spaced-apart, face-to-face arrangement without touching;
providing a thermally conducting and electrically insulating spacer between the die mount portion and the heat extraction portion for locking them together in the closely spaced-apart, face-to-face arrangement without touching; and
molding an electrically insulating encapsulating material substantially around the closely spaced-apart, face-to-face parallel faces.

12. The method of claim 11 wherein the first providing step comprises providing a two-piece leadframe.

13. A method for forming an electronic device, comprising:
providing a substantially planar leadframe having a die mount portion and a heat extraction portion, wherein the die mount portion has multiple fingers extending therefrom toward the heat extraction portion and the heat extraction portion has multiple fingers extending therefrom toward the die mount portion, and wherein the fingers are interleaved without touching thereby forming spaces between the interleaved fingers;

mounting an electronic component on the die mount portion; and substantially filling the spaces with a thermally conductive, electrically insulating material and encapsulating the component.

14. The method of claim 13 wherein the first providing step comprises etching or stamping a planar leadframe from a single sheet of metal.

15. The method of claim 13 wherein the steps of substantially filling the spaces and encapsulating the component comprise substantially filling the spaces and encapsulating the component by transfer or injection molding.

* * * * *